(12) United States Patent
Yokoyama-Martin et al.

(10) Patent No.: US 12,368,420 B1
(45) Date of Patent: Jul. 22, 2025

(54) CONSTANT-GAIN BIAS CIRCUIT

(71) Applicant: Synopsys, Inc., Sunnyvale, CA (US)

(72) Inventors: David Yokoyama-Martin, Portland, OR (US); Yi Luo, Beaverton, OR (US)

(73) Assignee: SYNOPSYS, INC., Sunnyvale, CA (US)

( * ) Notice: Subject to any disclaimer, the term of this patent is extended or adjusted under 35 U.S.C. 154(b) by 489 days.

(21) Appl. No.: 17/854,970

(22) Filed: Jun. 30, 2022

Related U.S. Application Data

(60) Provisional application No. 63/217,155, filed on Jun. 30, 2021.

(51) Int. Cl.
*H03F 3/45* (2006.01)
*H03G 1/00* (2006.01)
*H03G 3/00* (2006.01)

(52) U.S. Cl.
CPC ....... *H03G 1/0029* (2013.01); *H03F 3/45183* (2013.01); *H03G 3/001* (2013.01)

(58) Field of Classification Search
CPC ... H03G 1/0029; H03G 3/001; H03F 3/45183
USPC .......................................................... 330/254
See application file for complete search history.

(56) References Cited

U.S. PATENT DOCUMENTS 8,102,156 B2 * 1/2012 Nodo .................. H03F 3/45183
327/52

* cited by examiner

*Primary Examiner* — Andrea Lindgren Baltzell
*Assistant Examiner* — Khiem D Nguyen
(74) *Attorney, Agent, or Firm* — Womble Bond Dickinson (US) LLP

(57) ABSTRACT

A circuit includes an auxiliary circuit and a current generator circuit. The auxiliary circuit is implemented using a metal layer in a chip and operated using a bias current. The current generator circuit includes a metal resistor implemented as a trace using the metal layer. The current generator circuit generates the bias current based on the metal resistor and adjusts a value of the metal resistor in response to a change in a metal wiring resistance associated with the metal layer.

20 Claims, 10 Drawing Sheets

CONSTANT-GAIN BIAS CIRCUIT

RELATED APPLICATION

The present application claims the benefit under 35 U.S.C. § 119(e) of U.S. Provisional Patent Application No. 63/217,155 filed on Jun. 30, 2021, which is incorporated herein by reference in its entirety for all purposes.

TECHNICAL FIELD

The present disclosure relates to an integrated circuit. More specifically, the present disclosure relates to a constant-gain bias circuit.

BACKGROUND

High speed analog circuits can include gain stages that amplify an analog signal. The gain stages may include operational amplifiers (OpAmps) to process analog information. The OpAmps require current sources for biasing. A bias circuit may provide a bias current for the analog circuit.

SUMMARY

In some aspects, a circuit includes an auxiliary circuit and a current generator circuit. The auxiliary circuit is implemented using a metal layer in a chip and operates using a bias current. The current generator circuit includes a metal resistor implemented as a trace using the metal layer. The current generator circuit generates the bias current utilizing the metal resistor and adjusts the bias current in response to a change in a metal wiring resistance associated with the metal layer.

In some aspects, a method includes acquiring a chip layout for an auxiliary circuit and a current generator circuit. The current generator circuit includes an on-chip resistor and a metal resistor. The auxiliary circuit is implemented using a metal layer, and the metal resistor is implemented as a trace using the metal layer. The method also includes identifying a value for the on-chip resistor and the metal resistor such that a bias current of the current generator circuit is adjusted in response to a change in a metal wiring resistance associated with the metal layer.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to a constant gain bias circuit. The gain circuit includes a bias current that adjusts to compensate for metal wiring resistance.

Analog circuits (e.g., high-speed analog circuits) may include gain stages that amplify an analog signal. Gain stages may be implemented on a chip.

One type of bias circuit for the analog circuits is known as a constant transconductance (GM) bias circuit. The constant GM bias circuit creates a bias current. The bias current may be used by an analog amplifier to produce a constant gain. In some aspects, the gain is equal to $k1/R$, where $k1$ is a constant and $R$ is an on-chip resistance of the constant GM bias circuit. Since this amplifier's electric current is usually put through a resistor, the gain is equal to $k1/R \times k2 \times R = k1 \times k2$ that is a constant gain over process, voltage, temperature (PVT).

For advanced complementary metal-oxide-semiconductor (CMOS) processes, the resistance of metal wiring of the chip is becoming a speed and gain bottleneck. The resistance of the metal wiring is becoming an important factor in the overall gain and bandwidth of these amplifiers. The increase in the resistance of the metal wiring may lead to a decrease of the overall gain of the analog amplifier. In addition, the effective metal resistance of the chip varies widely both within a chip and from chip to chip. This effect should be taken into account by the constant GM bias circuit. Typical constant GM bias circuits may not account for the resistance of the metal wiring and may not modify the gain of the circuit to overcome the resistance of the metal wiring.

In some aspects, the constant GM circuit is modified to account for the metal wiring resistance in creating the bias current. One or more embodiments are directed towards adjusting the bias current for a gain circuit to compensate for metal wiring resistance. In some aspects, the circuit may be modified by including one or more elements that can sense the effect of the metal wiring resistance. By sensing an increase in the metal wiring resistance, the circuit can increase the bias current that in turn can increase the gain in the analog amplifier. For example, as the temperature changes, the metal resistance may change, and the bias current is adjusted accordingly.

Technical advantages of the present disclosure include, but are not limited to, providing a stable gain across PVT conditions and decreasing the effect of the increase of the metal wire resistance.

Figure 1:
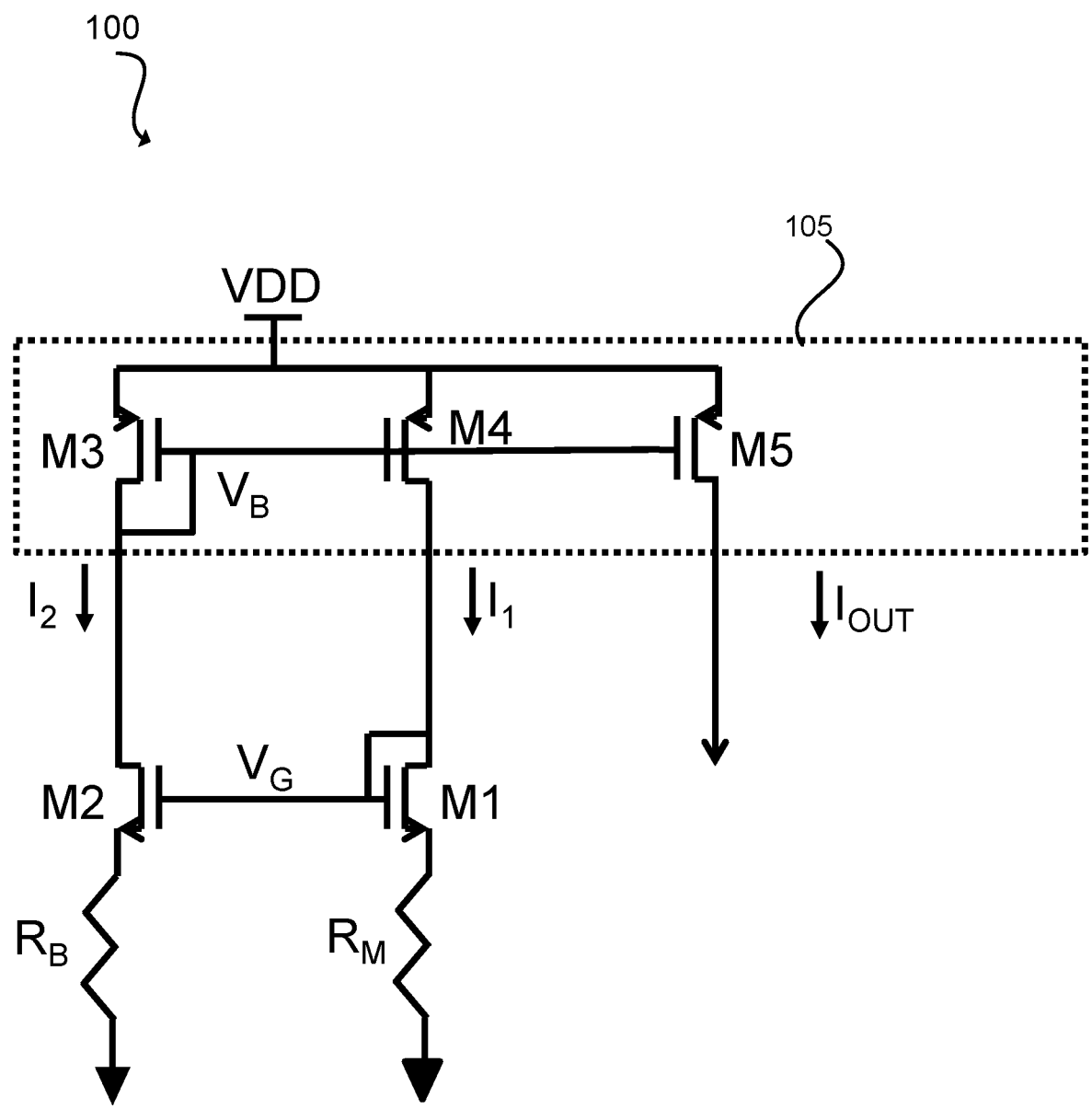
FIG. 1 is a schematic that shows a constant gain bias circuit, in accordance with an embodiment of the present disclosure.

FIG. 1 is a schematic that shows a current generator circuit, in accordance with an embodiment of the present disclosure. A current generator circuit 100 (also referred to as a constant gain bias circuit) includes a current mirror section 105. The current mirror section 105 includes a transistor M3, a transistor M4, and a transistor M5. In some aspects, transistor M3, transistor M4, and transistor M5 can be positive-type (p-type) transistors. In some aspects, transistor M3, transistor M4, and transistor M5 are of the same size.

In some aspects, transistor M3 and transistor M4 form a current mirror that forces a current I1 at the drain of transistor M4 and a current I2 at the drain of transistor M3 to be the same (or approximately the same) current. Circuit 100 may also include a transistor M2 and a transistor M1. Transistor M1 and transistor M2 have the same channel length.

In some aspects, circuit 100 can include an on-chip resistor $R_B$. $R_B$ can be implemented as a passive resistor. The passive resistor may be formed using thin film technology or as thick film resistor. A resistor $R_M$ is added to the source of transistor M1. Unlike resistor $R_B$, $R_M$ is formed by a long trace of a metal wiring. The metal wiring reflects the actual metal wiring in circuit 100. The metal wiring uses the same metal and via layers and widths whenever possible such that the properties of the layers are similar to the actual metal wiring as each metal layer may have a different resistance. In some aspects, resistor $R_M$ may use all the metal layers or a portion of the metal layers such that the resistor $R_M$ tracks the metal layers actually used in the gain circuit.

The gain gm1 of transistor M1 is equal to $(1/R_B-R_M) \times 2 \times (1-\text{sqrt}(W1/W2))$, where W1 and W2 refer to the channel widths of transistor M1 and transistor M2 respectively. If the width of transistor M2 is four times the size of transistor M1, the gain simplifies to $(1/R_B-R_M)$. Transistor M5 uses a voltage VB at the base of transistor M3 to mirror the current out to be used by other circuits (e.g., the gain circuit).

As the metal wiring gets more resistive and hurts gain/bandwidth (BW), the bias current may go up to compensate.

In some embodiments, other variations of the circuit gain may be used. Variations to the constant gain bias circuit may improve either the mirror formed by transistor M3, transistor M4, and transistor M5 or the mirror formed by transistor M1 and transistor M2, add power down switches, or improve its start-up behavior.

Resistor $R_B$ is first adjusted to set a gain/BW of the gain stage with typical metal extraction. For example, $R_B$ may be a function of the gain (e.g., inversely proportional to the gain). Then, at the worst-case extraction corner, $R_M$ is adjusted so that the gain/BW is the same as before (i.e., at typical metal extraction). The value of $R_M$ as a fraction of $R_B$ may depend on how much the metal resistance varies over extraction corners.

Figure 2:
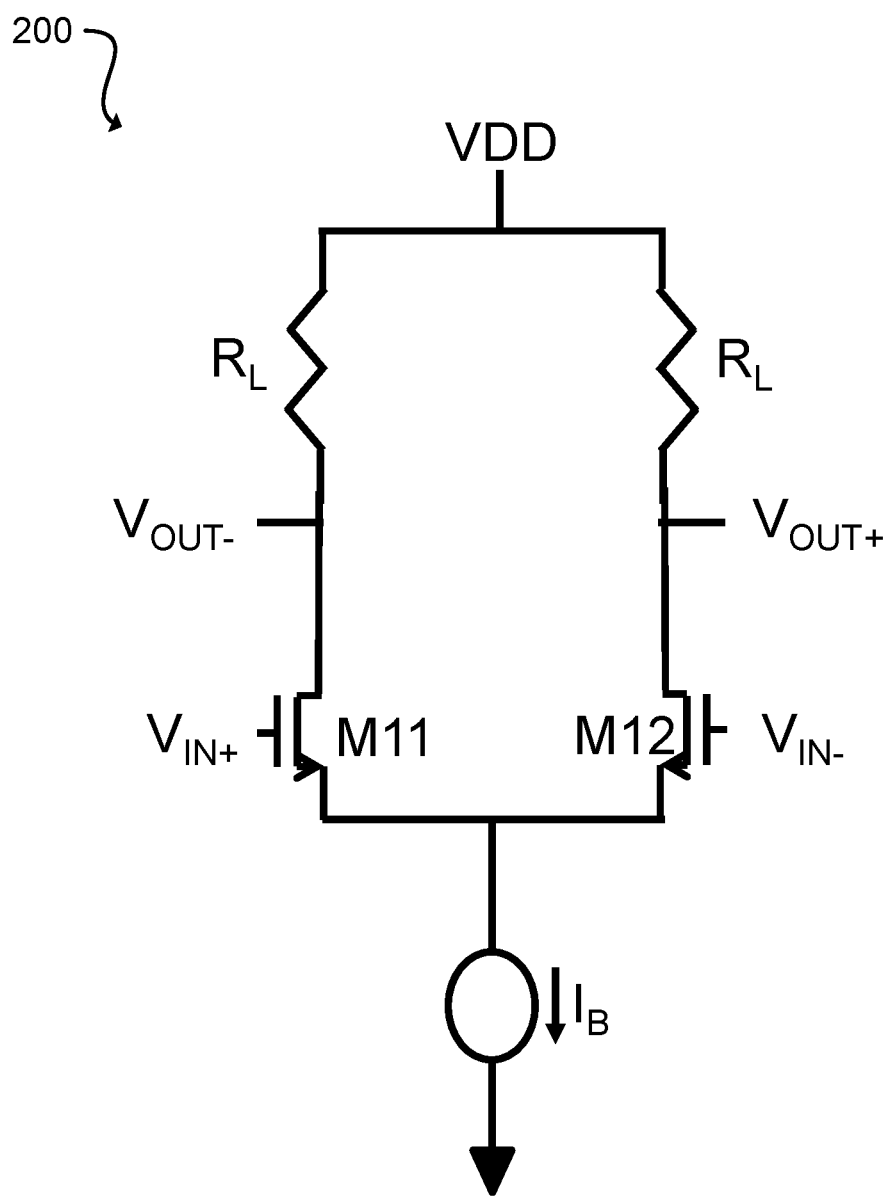
FIG. 2 is a schematic that shows a gain circuit, in accordance with an embodiment of the present disclosure.

FIG. 2 is a schematic that shows a gain circuit 200, in accordance with an embodiment of the present disclosure. Gain circuit 200 can be a differential pair amplifier with a resistor load ($R_L$) (i.e., a resistor placed at the output of gain circuit 200). Gain circuit 200 may amplify an input signal (e.g., $V_{IN}$). Output signal VOUT represents the amplified signal. Gain circuit 200 includes a transistor M11 and a transistor M12. In some aspects, transistor M11 and transistor M12 are of the same size. In addition, transistor M11 and transistor M12 have the same length L as transistor M1 and transistor M2 in FIG. 1. The bias current $I_B$ is a mirrored version of the bias circuit output current $I_{OUT}$ in FIG. 1.

The gain of circuit 200 is typically equal to $gm_{11} \times R_L$. $Gm_{11}$ is the gain of transistor M11. The gain of transistor M11 is a function of the bias current $I_B$. Since the circuit 100 of FIG. 1 produces a current such that the gain of M1 is $1/(R_B-R_M)$, then the gain of M11 is also proportional to $1/(R_B-R_M)$, so the gain of the circuit in FIG. 2 is equal to $(1/(R_B-R_M)) \times R_L \times K = K \times (R_L/(R_B-R_M))$. K is a constant used to take into account any current mirror ratios from FIG. 1 to FIG. 2.

Figure 3:
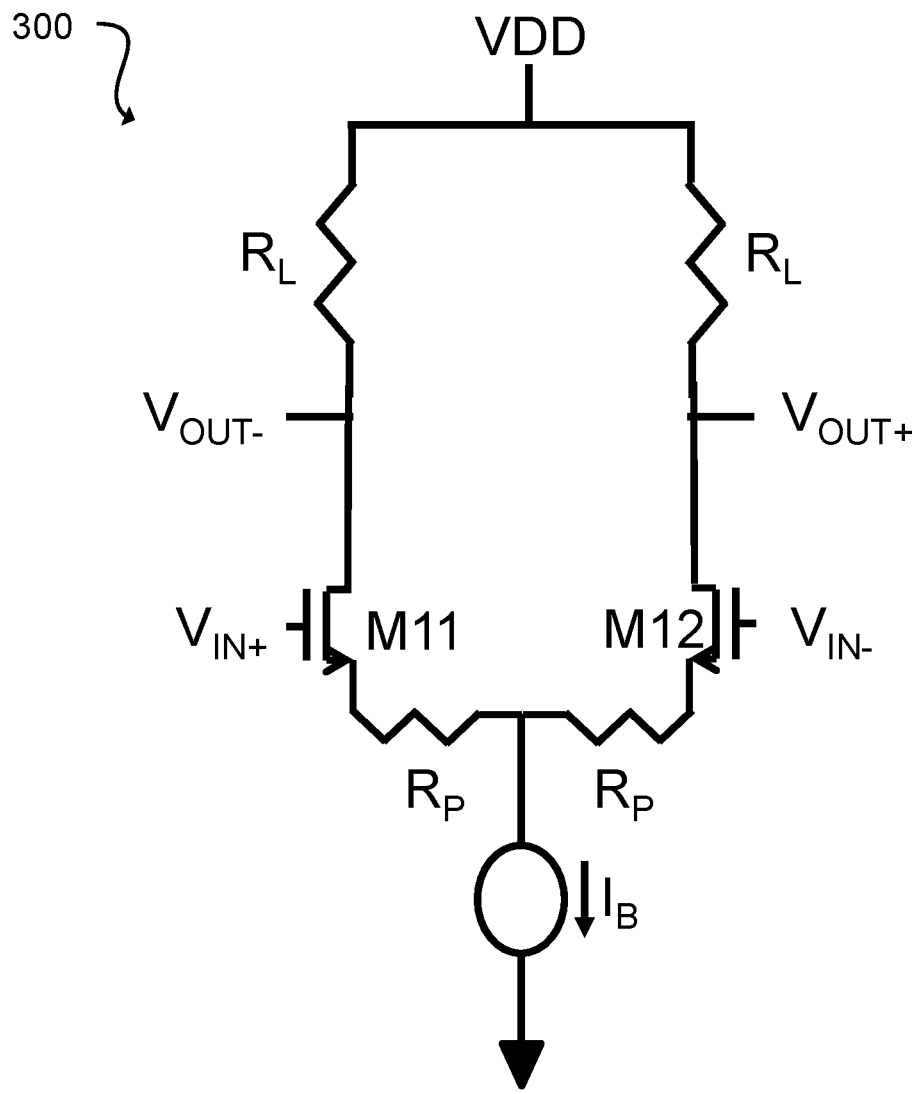
FIG. 3 is a schematic that shows a gain circuit with parasitic metal, in accordance with an embodiment of the present disclosure.

FIG. 3 is a schematic that shows a gain circuit 300 in accordance with an embodiment of the present disclosure. Gain circuit 300 is a differential pair amplifier with a resistor load ($R_L$). Gain circuit 300 includes a transistor M11 and a transistor M12. In some aspects, transistor M11 and transistor M12 are of the same size. In addition, transistor M11 and transistor M12 have the same length L as transistor M1 and transistor M1 in FIG. 1. The bias current $I_B$ is a mirrored version of the bias circuit output current $I_{OUT}$ in FIG. 1.

In some embodiments, there is normally some wiring resistance between the sources of transistor M11 and transistor M12. The wiring resistance may be modelled by adding a resistance Rp at the source of transistor M11 and transistor M12. The resistance may degrade the gain of the circuit. This degradation in gain may vary depending on the metal resistance extraction corner. Thus, the gain may be expressed as $K \times (R_L/(R_B-R_M)) \times K_D$, where $K_D$ is a degradation value less than 1. So, for the initial adjustment of $R_B$ (with $R_M$ equal to 5% of $R_M$), $R_B$ is adjusted so that the circuit has a desired gain with typical metal extraction values. Note that if how much $R_P$ has degraded the gain of the circuit is known (i.e., the variable $K_D$), this value can be used instead of 5%. In practice, determining $K_D$ can be difficult.

Figure 4:
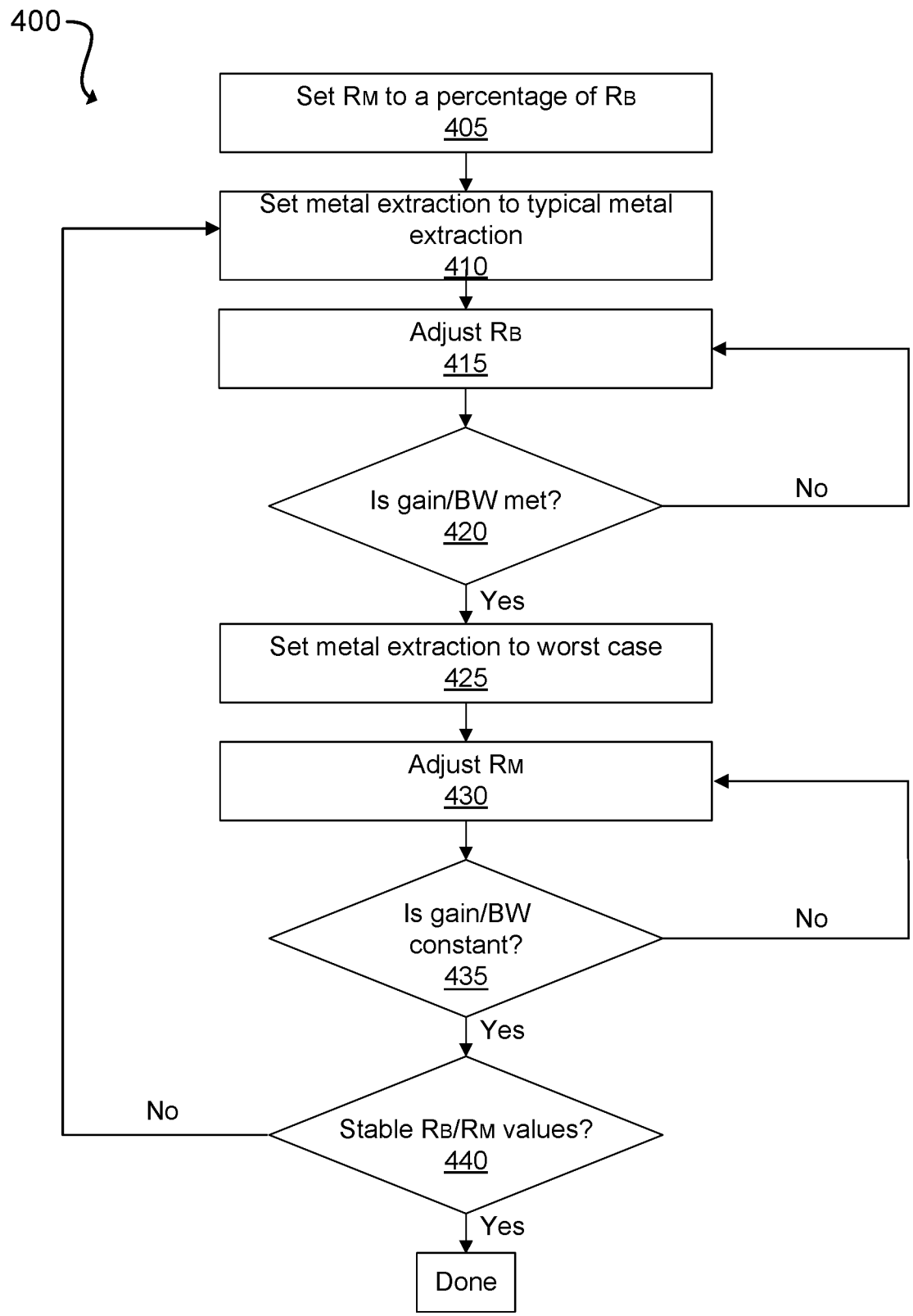
FIG. 4 is a flowchart for a method for selecting sizes for an on-chip resistor and a metal resistor, in accordance with an embodiment of the present disclosure.

FIG. 4 is a flowchart for a method 400 for selecting an on chip resistor $R_B$ and a metal resistor $R_M$ for the bias circuit or the current generator circuit, in accordance with an embodiment of the present disclosure.

In 405, $R_M$ is initially set to a percentage (e.g., a predetermined percentage such as 5%) of $R_B$. The percentage (e.g., 5%) reflects the amount of the resistance in the gain circuit. In some aspects, $R_M$ is initially set to less than 10% of $R_B$.

In 410, metal extraction is set to typical metal extraction in a layout extraction tool. The typical metal extraction may correspond to a nominal PVT.

In 415, resistance $R_B$ is adjusted until the gain/BW is met. For example, $R_B$ is adjusted until a desired gain/BW is obtained.

In 420, a determination is made whether the gain/BW is met. In response to determining that the gain/BW is met (i.e., resulting in a "yes" in 420), the process proceeds to step 425. In response to determining that the gain/BW is not met (i.e., resulting in a "No" in 420), the process proceeds to step 415.

In 425, the metal extraction is set to the worst case (PVT condition). For example, the PVT condition may correspond to a slow process, a lowest voltage, a highest temperature. In other embodiments, the metal extraction is set to the best case. For example, the PVT condition may be set to a fast process, a highest voltage, and a lowest temperature.

In 430, $R_M$ is adjusted. For example, the value of $R_M$ may be incremented/decremented by a preset value.

In 435, a determination is made whether the gain/BW is equal to the gain/BW of step 420. In response to determining that the gain/BW is the same (i.e., resulting in a "yes" in 435), the process proceeds to step 440. In response to determining that the gain/BW is not met (i.e., resulting in a "No" in 435), the process proceeds to step 430.

In 440, a determination is made whether the values of resistance $R_B$ and resistance $R_M$ are stable. In response to determining that the values of resistance $R_B$ and resistance $R_M$ are stable, the process ends. In response to determining that the values of resistance $R_B$ and resistance $R_M$ are not stable, the process returns to step 410. In one embodiment, the $R_B$ or $R_M$ values may be considered stable if they are unchanged or remain within a threshold range over a threshold number of runs. A run may be considered from 410 to 435. The threshold range may be less than about a 10% change. For example, the value of $R_B$ or $R_M$ values may be compared to a previous value of $R_B$ or $R_M$, respectively. If a difference between the current value and a previous value of $R_B$ or $R_M$ is within a threshold, then $R_B$ or $R_M$ are stable and the process may end.

As previously discussed, $R_M$ is adjusted and the circuit is re-extracted at the worst-case (highest) metal extraction corner. Then, the gain is recalculated. The gain of circuit 300 of FIG. 3 may be lower since $R_P$ is even higher. But, the gain can also be higher since the current from the bias circuit 100 of FIG. 1 is higher. $R_M$ may be readjusted so that the higher bias current cancels the gain-lowering-effect of $R_P$. As shown in the flowchart in FIG. 4, this process may be repeated until $R_B$ and $R_M$ values converge.

In some embodiments, the variation in gain due to wiring resistance went from 6 dB before using $R_M$ to 1 dB afterwards. Thus, as previously described, the additional resistor provides a stable gain across PVT conditions and decreases the effect of the increase of the metal wire resistance.

Figure 5:
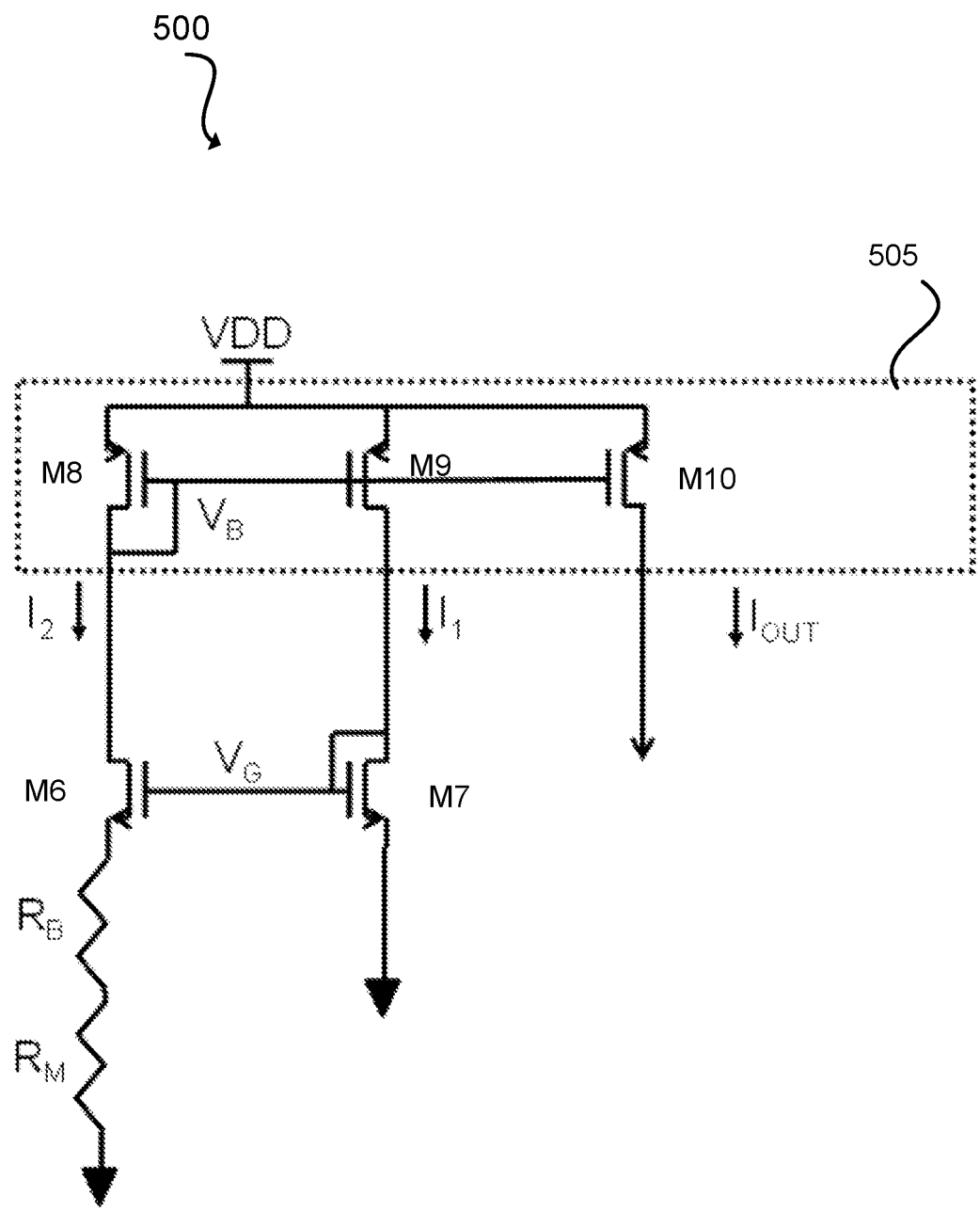
FIG. 5 is a schematic that shows a constant gain bias circuit, in accordance with another embodiment of the present disclosure.

FIG. 5 is a schematic that shows a current generator circuit in accordance with an embodiment of the present disclosure. In some embodiments, a resistance $R_M$ may be placed in series with a resistance $R_B$. This make the bias current go down with a higher metal resistance (as opposite to up in FIG. 1).

A current generator circuit 500 includes a current mirror section 505. Current mirror section 505 includes a transistor M8, a transistor M9, and a transistor M10. In some aspects, transistor M8, transistor M9, and transistor M10 can be p-type transistors.

In some aspects, transistor M8 and transistor M10 form a current mirror that forces a current I1 at the drain of transistor M9 and a current I2 at the drain of transistor M8 to be the same (or approximately the same) current. Circuit 500 may also include a transistor M6 and a transistor M7. Transistor M6 and transistor M7 have the same channel length.

An additional resistor (labelled $R_M$) is added in series to an on-chip resistor (labelled $R_B$), $R_M$ is formed by a long trace of a metal wiring. The metal wiring reflects the actual metal wiring in circuit 500. The metal wiring uses the same metal and via layers and widths whenever possible such that the properties of the layers are similar to the actual metal wiring as each metal layer may have a different resistance.

Figure 6:
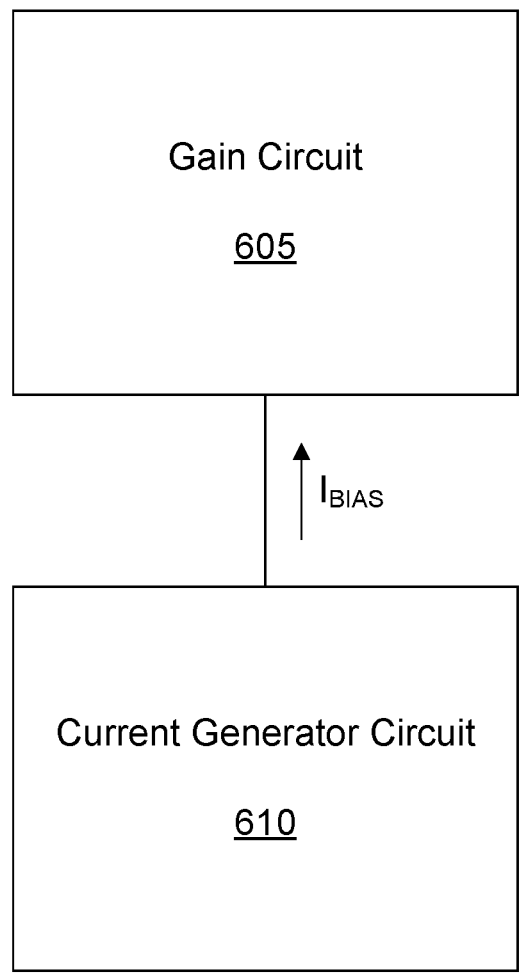
FIG. 6 is a schematic that shows a system with a gain circuit and a current generator circuit, in accordance with an embodiment of the present disclosure.

FIG. 6 is a schematic that shows a gain circuit 605 and a current generator circuit 610, in accordance with an embodiment of the present disclosure. Both gain circuit 605 and current generator circuit 610 may be located on a chip. The gain circuit 605 is configured to amplify a signal ($V_{IN}$). Gain circuit 605 operates using the bias current ($I_{BIAS}$). Gain circuit 605 implementation may use a set of metal layers and vias (e.g., one or more metal layers and vias) of the chip. Gain circuit 605 may correspond to the gain circuit shown in FIGS. 2 and 3.

In some embodiments, as temperatures and/or signal frequencies increase, the resistance of the metal wiring in the gain circuit 605 becomes more significant. In FIG. 3, the resistance of the metal wiring is modeled as resistors $R_P$.

Resistors $R_P$ reduce the gain of the gain circuit 605. However, this reduction may be mitigated by increasing the bias current ($I_{BIAS}$).

Current generator circuit 610 generates the bias current $I_{BIAS}$ to operate gain circuit 605. Current generator circuit 610 may increase the bias current $I_{BIAS}$ to offset the effect of resistance $R_P$ on the gain of gain circuit 605. Current generator circuit 610 may correspond to the current generator circuit shown in FIG. 1. Accordingly, current generator circuit 610 may include an on-chip resistor ($R_B$) and a metal resistor ($R_M$). The metal resistor ($R_M$) may be implemented as a trace using some or all of the metal layers and vias used to implement the gain circuit 605. Thus, the metal resistance changes experienced by gain circuit 605 are also experienced by $R_M$. As discussed above, the bias current $I_{BIAS}$ generated by current generator circuit 610 is a function of $R_B$ and $R_M$, and an increase in $R_M$ may increase current $I_{BIAS}$. Although FIG. 6 explicitly shows current generator circuit 610 providing a bias current to gain circuit 605, current generator circuit 610 may provide a bias current to any auxiliary circuit. Examples of auxiliary circuits include, but are not limited to, gain circuits (e.g., gain circuit 605), filters, oscillators, phase mixers, and the like.

Figure 7:
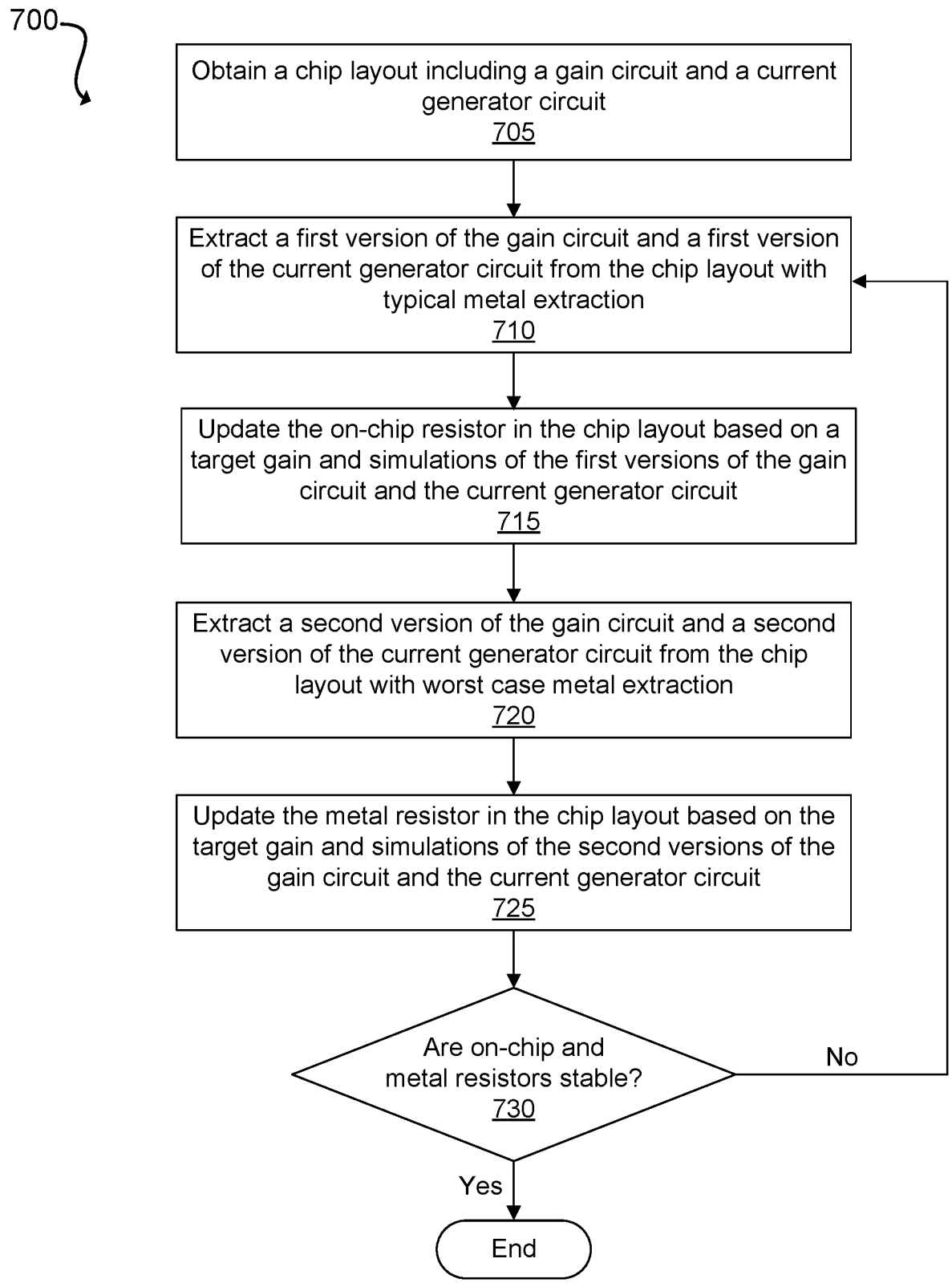
FIG. 7 is a flowchart for selecting an on-chip resistor and a metal resistor, in accordance with an embodiment of the present disclosure.

FIG. 7 shows a flowchart for a method 700 for selecting an additional resistance for a bias circuit in accordance with an embodiment of the present disclosure.

At 705, a chip layout is obtained. The chip layout includes an auxiliary circuit (e.g., gain circuit 605) and a current generator circuit (e.g., current generator 610). The current generator circuit is configured to generate a bias current for operating the auxiliary circuit. The auxiliary circuit may be implemented using a set of metal layers and vias of the chip. The current generator circuit may include an on-chip resistor (e.g., $R_B$) and an additional metal resistor (e.g., $R_M$). The additional metal resistor may be implemented as a trace using a portion (e.g., one or more) of the metal layers and vias used to implement the auxiliary circuit. The on-chip resistor may have been selected such that the auxiliary circuit amplifies an input signal (e.g., $V_{IN}$ shown in FIG. 2 and FIG. 3) by a target gain. The additional metal resistor may have been set to 0 or to a percentage of $R_B$ (e.g., $R_M$=7% of $R_B$).

At 710, a first version of the auxiliary circuit and a first version of the current generator circuit are extracted from the chip layout at a first metal extraction condition (e.g., a typical metal extraction).

At 715, the first version of the auxiliary circuit and the first version of the current generator circuit are simulated (post layout simulations) and the on-chip resistor is adjusted until the amplification by the auxiliary circuit in the simulation equals (or approximately equals) the target gain or other desired metric. The chip layout may be updated with this new on-chip resistor. In some aspects, at 715, only the on-chip resistor is adjusted and the additional metal resistor is not adjusted to meet the target gain.

At 720, a second version of the auxiliary circuit and a second version of the current generator circuit are extracted from the chip layout at a second metal extraction condition (e.g., with worst case metal extraction). It is appreciated that the first metal extraction condition and the second metal extraction condition may correspond to any PVT corner without deviating from the scope of the present disclosure.

At 725, the second version of the auxiliary circuit and the second version of the current generator circuit are simulated (post layout simulations), and the additional resistor is adjusted until the amplification (or other metric) by the auxiliary circuit in the simulation equals (or approximately equals) the target gain or other desired metric. The chip layout may be updated with the new value of the additional resistor. In some embodiments, at 725, only the additional resistor is adjusted and the on-chip resistor is not adjusted to meet the target gain.

At 730, it is determined whether a criteria is satisfied. For example, it is determined whether the values of the on-chip resistor and the metal resistor are stable. In some embodiments, the on-chip resistor is stable if the difference between the current value of the on-chip resistor and the previous value of the on-chip resistor is less than a threshold. In some embodiments, the value of the additional resistor is stable if the difference between the current value of the additional resistor and the previous value of the additional resistor is less than a threshold (the same or a different threshold than the threshold associated with the on-chip resistor). The threshold may be less than 10% variation between the current and the previous values. When it is determined that either the on-chip resistor or the additional resistor is unstable, the process returns to 710. When it is determined that both the on-chip resistor and the additional resistor are stable, the process may end.

Figure 8:
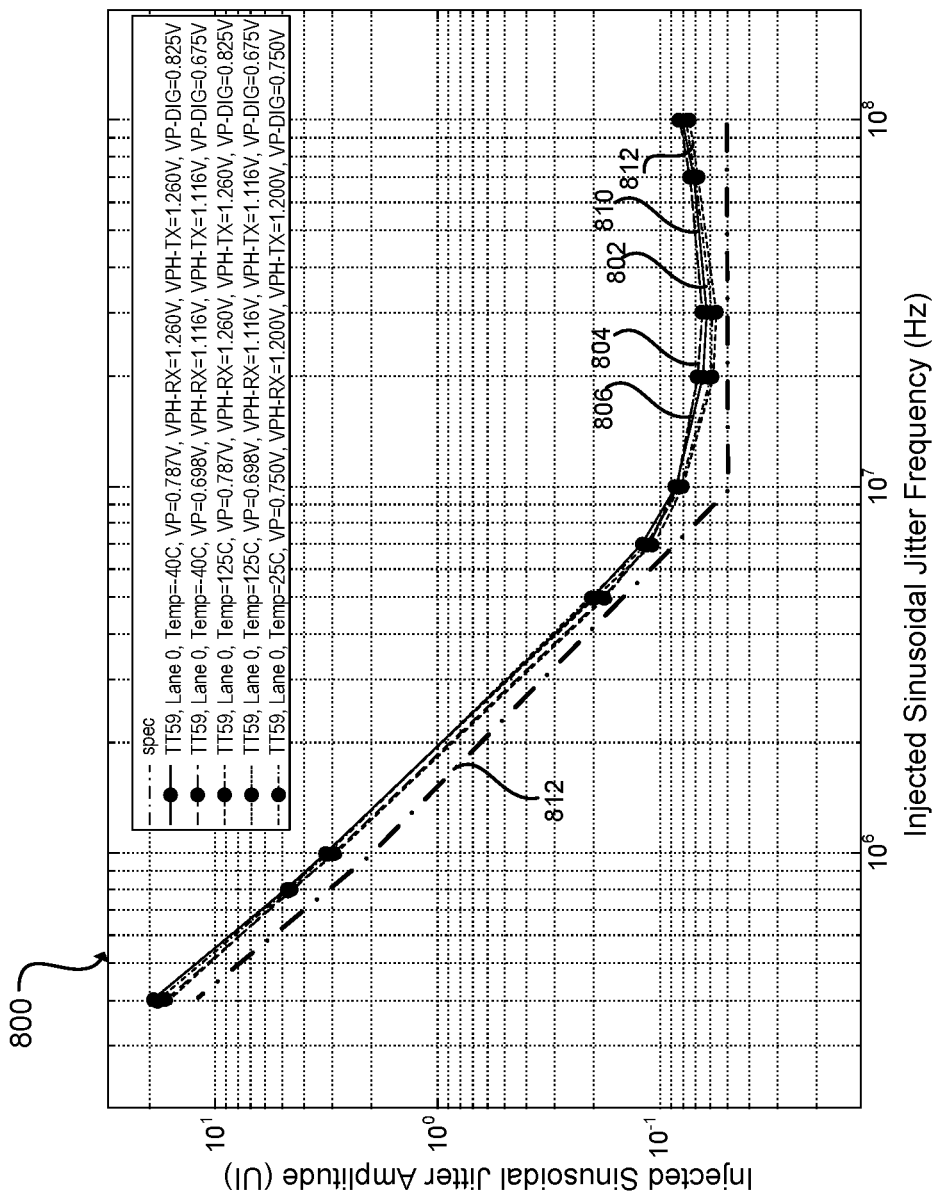
FIG. 8 is a schematic that shows exemplary results, in accordance with an embodiment of the present disclosure.

FIG. 8 is a data plot that shows exemplary results, in accordance with an embodiment of the present disclosure. A test chip including a gain circuit and a current generator circuit was created and tested. The current generator circuit included an additional resistor as described previously herein. The test chip was evaluated using a jitter tolerance (JTOL) test. The JTOL test is part of the communication standard for sending data between chips (PCIE 6.0). The current highest speed version of this standard is PCIE 6.0 that transmits data at 64 Gb/s. All details of the test were carried out as specified by the PCIE 6.0 standard. The result of the test is shown in graph 800. The plot shows five curves. Curve 802 is for nominal voltage and temperature. The others are for the extremes of power supply voltage and temperature. Curve 804 is for temperature equals to −40 C and Vp equals to 0.787 V. Curve 806 is for temperature equals to −40 C and Vp equals to 0.698 V. Curve 808 is for temperature equals to 125 C and Vp equals to 0.787 V. Curve 810 is for temperature equals to 125 C and Vp equals to 0.698 V. Curve 812 shows the desired amplitude. Note that, despite great variations in power supply voltage and temperature, the performance is almost the same (i.e., the curves are aligned with each other and with desired curve 812). This shows that the bias circuit technique described herein keeps the circuit performance constant.

Figure 9:
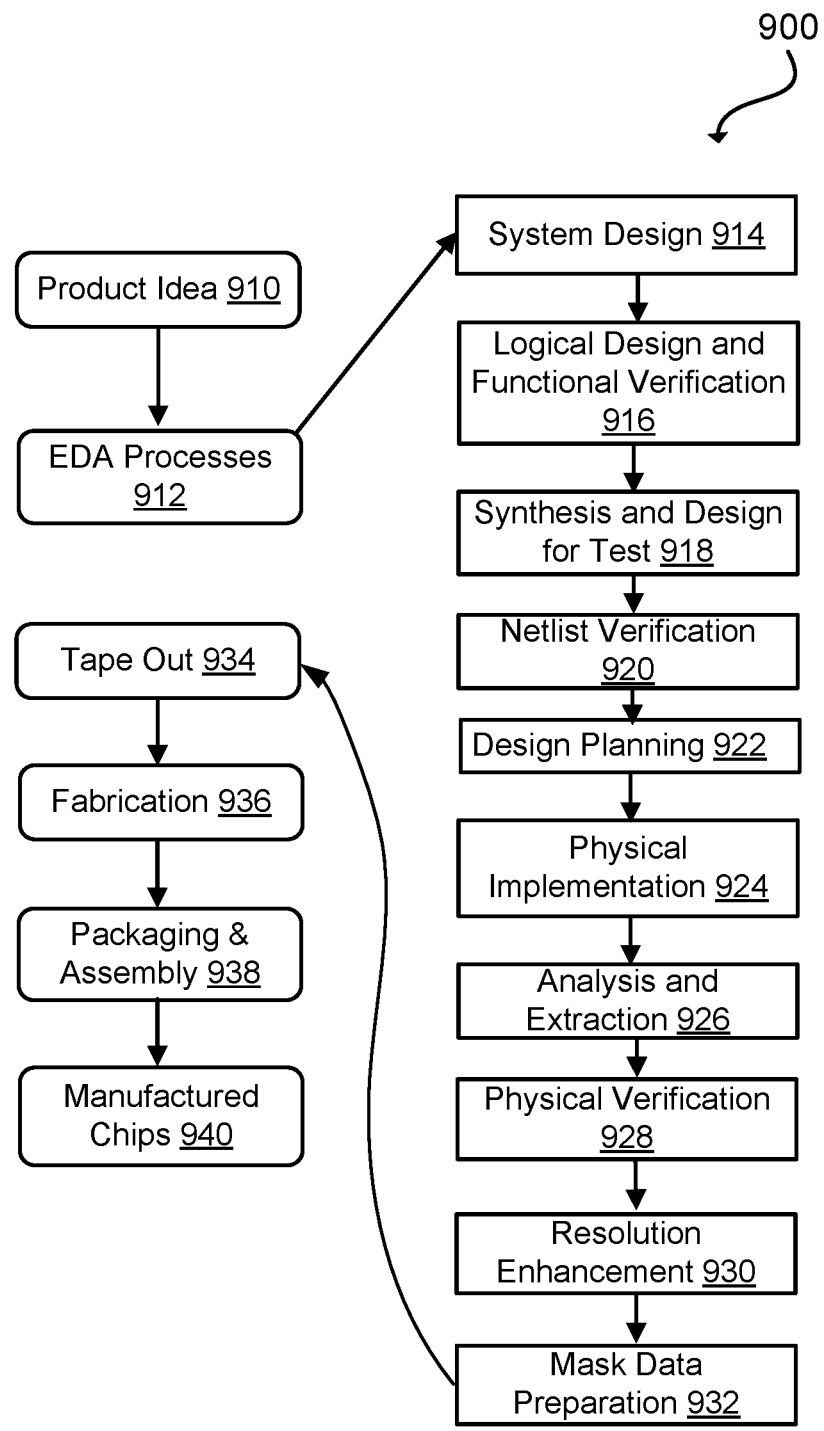
FIG. 9 depicts a flowchart of various processes used during the design and manufacture of an integrated circuit in accordance with some embodiments of the present disclosure.

FIG. 9 illustrates an example set of processes 900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 910 with information supplied by a designer, information which is transformed to create an article of manufacture that uses a set of EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly processes 938 are performed to produce the finished integrated circuit 940.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 9. The processes described can be enabled by EDA products (or EDA systems).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

Figure 10:
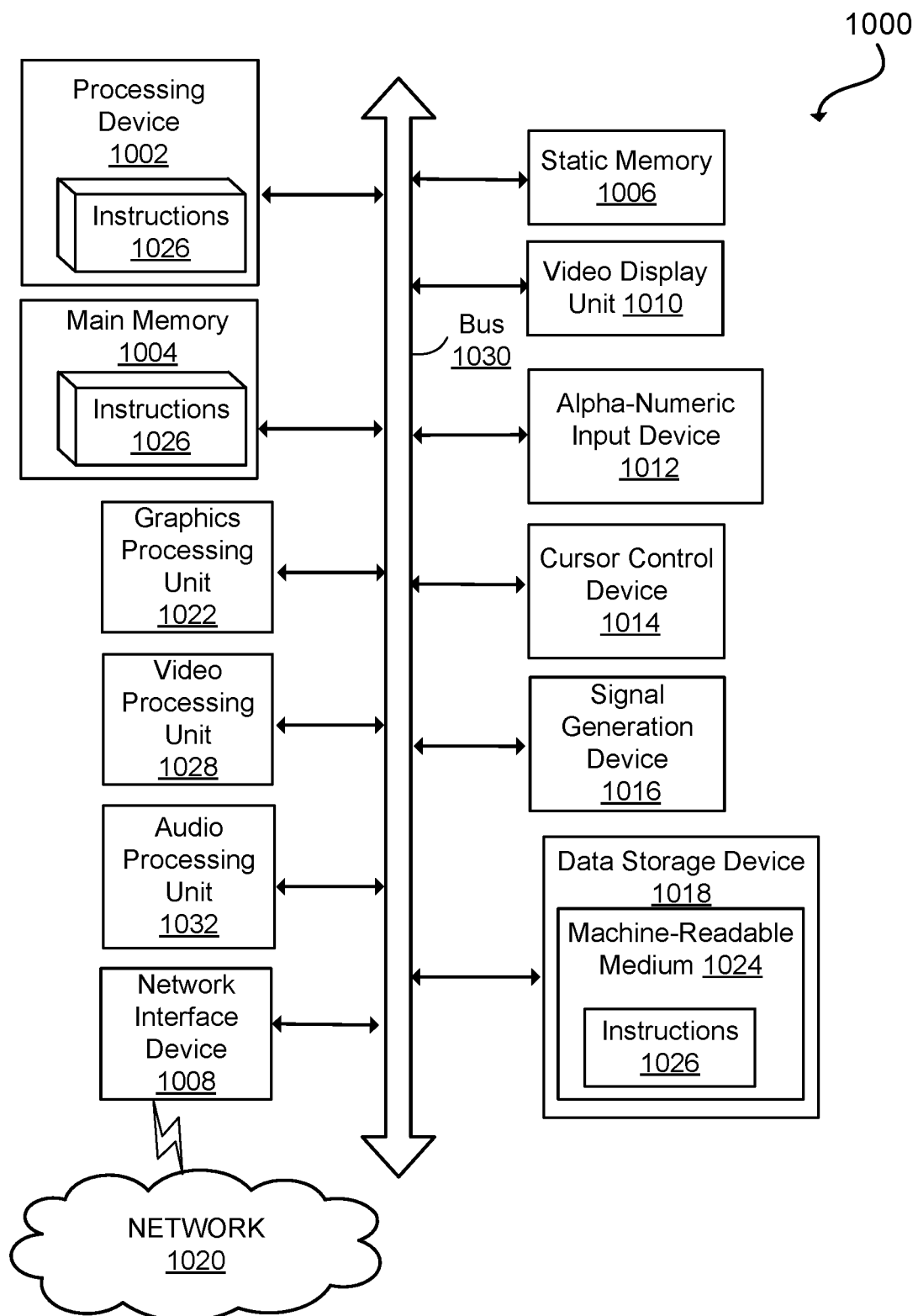
FIG. 10 depicts a diagram of an example computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit, comprising:
an auxiliary circuit implemented using a metal layer in a chip and operated using a bias current; and
a current generator circuit comprising a metal resistor implemented as a trace using the metal layer, wherein the current generator circuit is configured to:
generate the bias current utilizing the metal resistor; and
adjust a value of the metal resistor in response to a change in a metal wiring resistance associated with the metal layer to adjust the bias current.

2. The circuit of claim 1, wherein the auxiliary circuit comprises a gain circuit associated with a gain;
wherein increasing the metal wiring resistance associated with the metal layer decreases the gain; and
wherein the current generator circuit is configured to adjust the bias current by increasing the bias current to offset the decrease in the gain.

3. The circuit of claim 1, wherein the current generator circuit is configured to decrease the bias current operating the auxiliary circuit in response to an increase in the metal wiring resistance associated with the metal layer.

4. The circuit of claim 1, wherein the current generator circuit comprises:
a first transistor and a second transistor connected at their respective gates; and
an on-chip resistor coupled at a source of the first transistor, wherein the metal resistor is coupled at the source of the second transistor.

5. The circuit of claim 1, wherein the current generator circuit comprises:
a first transistor; and
an on-chip resistor coupled at a source of the first transistor, wherein the metal resistor is coupled in series with the on-chip resistor.

6. The circuit of claim 1, wherein the auxiliary circuit comprises one or more of a filter, an oscillator, or a phase mixer.

7. The circuit of claim 1, wherein the value of the metal resistor is selected such that the value of the metal resistor is stable for at least one of a plurality of metal extraction conditions comprising:
a worst case metal extraction; and
a best case metal extraction.

8. A method, comprising:
acquiring a chip layout for an auxiliary circuit and a current generator circuit, wherein the current generator circuit comprises an on-chip resistor and a metal resistor, wherein the auxiliary circuit is implemented using a metal layer;
identifying, using one or more processors, a value for the on-chip resistor and the metal resistor such that a bias current of the current generator circuit is adjusted in response to a change in a metal wiring resistance associated with the metal layer; and
implementing the metal resistor as a trace using the metal layer.

9. The method of claim 8, wherein the auxiliary circuit is a gain circuit and the method further comprising:
extracting a first version of the gain circuit and a first version of the current generator circuit from the chip layout with a first metal extraction condition;
updating the on-chip resistor in the chip layout based on a target gain and simulations of the first version of the gain circuit and the current generator circuit;
extracting a second version of the gain circuit and a second version of the current generator circuit from the chip layout with a second metal extraction condition;
updating the metal resistor in the chip layout based on the target gain and simulations of the second versions of the gain circuit and the current generator circuit; and
repeating the extracting and updating steps until the on-chip resistor and the metal resistor are stable.

10. The method of claim 9, wherein the first metal extraction condition corresponds to a typical metal extraction and a second metal extraction condition corresponds to a worst case metal extraction.

11. The method of claim 9, wherein the on-chip resistor and the metal resistor are stable when a first difference between a value of the on-chip resistor for the first metal extraction condition and the value of the on-chip resistor for the second metal extraction condition and a second difference between a value of the metal resistor for the first metal extraction condition and the value of the metal resistor for the second metal extraction condition are less than a threshold.

12. The method of claim 8, further comprising
implementing the metal resistor at a source of a first transistor of the current generator circuit, wherein the on-chip resistor is coupled at the source of a second transistor of the current generator circuit and wherein the first transistor and the second transistor are coupled together at their respective gate.

13. The method of claim 8, further comprising:
implementing the metal resistor in series with the on-chip resistor, wherein the on-chip resistor is coupled at a source of a transistor of the current generator circuit.

14. The method of claim 8, further comprising:
setting an initial value of the metal resistor based on a value of the on-chip resistor.

15. A non-transitory computer readable medium comprising stored instructions, the instructions, which when executed by a processor, cause the processor to:
acquire a chip layout for an auxiliary circuit and a current generator circuit, wherein the current generator circuit comprises an on-chip resistor and a metal resistor; and
identify a value for the on-chip resistor and the metal resistor such that a bias current of the current generator circuit is adjusted in response to a change in a metal wiring resistance of a metal wire in a chip and wherein the metal resistor is implemented as a trace using a metal layer.

16. The non-transitory computer readable medium of claim 15, wherein the auxiliary circuit is a gain circuit and the processor is further configured to:
extract a first version of the gain circuit and a first version of the current generator circuit from the chip layout with a first metal extraction condition;
update the on-chip resistor in the chip layout based on a target gain and simulations of the first version of the gain circuit and the current generator circuit;
extract a second version of the gain circuit and a second version of the current generator circuit from the chip layout with a second metal extraction condition;
update the metal resistor in the chip layout based on the target gain and simulations of the second versions of the gain circuit and the current generator circuit; and
repeat the extracting and updating steps until the on-chip resistor and the metal resistor are stable.

17. The non-transitory computer readable medium of claim 16, wherein the first metal extraction condition corresponds to a typical metal extraction and a second metal extraction corresponds to a worst case metal extraction.

18. The non-transitory computer readable medium of claim 16, wherein the on-chip resistor and the metal resistor are stable when a first difference between a value of the on-chip resistor for the first metal extraction condition and the value of the on-chip resistor for the second metal extraction condition and a second difference between a value of the metal resistor for the first metal extraction condition and the value of the metal resistor for the second metal extraction condition are less than a threshold.

19. The non-transitory computer readable medium of claim 15, wherein the processor is further configured to:
implement the metal resistor at a source of a first transistor of the current generator circuit, wherein the on-chip resistor is coupled at the source of a second transistor of the current generator circuit and wherein the first transistor and the second transistor are coupled together at their respective gate.

20. The non-transitory computer readable medium of claim 15, wherein the processor is further configured to:
implement the metal resistor in series with the on-chip resistor, wherein the on-chip resistor is coupled at a source of a transistor of the current generator circuit.

* * * * *